United States Patent
Jang et al.

(10) Patent No.: US 10,943,082 B2
(45) Date of Patent: Mar. 9, 2021

(54) DISPLAY DEVICE

(71) Applicant: SAMSUNG DISPLAY CO., LTD., Yongin-si (KR)

(72) Inventors: Hyoungwook Jang, Sejong-si (KR); Yun-Ho Kim, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 2 days.

(21) Appl. No.: 15/708,325

(22) Filed: Sep. 19, 2017

(65) Prior Publication Data
US 2018/0150670 A1 May 31, 2018

(30) Foreign Application Priority Data

Nov. 28, 2016 (KR) .................. 10-2016-0159634

(51) Int. Cl.
| G06K 9/00 | (2006.01) |
| G06F 3/042 | (2006.01) |
| G06F 3/0488 | (2013.01) |
| H01L 27/32 | (2006.01) |
| G06F 3/041 | (2006.01) |
| G06F 3/044 | (2006.01) |
| G09G 3/3233 | (2016.01) |
| H01L 31/0232 | (2014.01) |
| H01L 31/102 | (2006.01) |

(Continued)

(52) U.S. Cl.
CPC ......... *G06K 9/0004* (2013.01); *G06F 3/0421* (2013.01); *G06F 3/0488* (2013.01); *G06K 9/00053* (2013.01); *H01L 27/323* (2013.01); *H01L 27/3227* (2013.01); *H01L 27/3269* (2013.01); *G06F 3/044* (2013.01); *G06F 3/0412* (2013.01); *G06F 2203/04106* (2013.01); *G09G 3/3233* (2013.01); *H01L 27/3262* (2013.01); *H01L 27/3272* (2013.01); *H01L 31/02327* (2013.01); *H01L 31/102* (2013.01);
(Continued)

(58) Field of Classification Search
CPC ............. G06K 9/0004; G06K 9/00053; H01L 27/3269; H01L 27/323; H01L 27/3227; H01L 27/3267; H01L 31/02327; H01L 31/102; H01L 31/1136; G06F 3/0421; G06F 3/0488; G06F 3/044; G06F 3/0412; G06F 2203/04106; G09G 3/3233
See application file for complete search history.

(56) References Cited

U.S. PATENT DOCUMENTS

2002/0150284 A1* 10/2002 Iwai .................... G06K 9/0004
382/124
2008/0259432 A1* 10/2008 Kawai .................... G02F 1/167
359/271
(Continued)

FOREIGN PATENT DOCUMENTS

| KR | 100436376 | 6/2004 |
| KR | 1020160029697 | 3/2016 |
| KR | 1020160056388 | 5/2016 |

*Primary Examiner* — Alexander Eisen
*Assistant Examiner* — Kebede T Teshome
(74) *Attorney, Agent, or Firm* — F. Chau & Associates, LLC

(57) ABSTRACT

A display device includes a first base layer, a circuit layer disposed on the first base layer and including a plurality of switching elements, a pixel layer disposed on the circuit layer and including a light emitting element, wherein the light emitting element is configured to receive a current from at least one of the plurality of switching elements to emit a first light, and a sensor layer disposed below the first base layer and including a sensor, wherein the sensor is configured to receive a second light generated when the first light is reflected by an external object.

21 Claims, 15 Drawing Sheets

(51) Int. Cl.
*H01L 31/113* (2006.01)
*H01L 51/52* (2006.01)

(52) U.S. Cl.
CPC ....... *H01L 31/1136* (2013.01); *H01L 51/5246* (2013.01); *H01L 2251/5338* (2013.01); *Y02E 10/52* (2013.01)

(56) References Cited

U.S. PATENT DOCUMENTS

| | | | |
|---|---|---|---|
| 2009/0160815 A1* | 6/2009 | Steer | G01S 3/782 345/173 |
| 2010/0156827 A1* | 6/2010 | Joo | G02F 1/13338 345/173 |
| 2010/0283765 A1* | 11/2010 | Gotoh | G06F 3/0412 345/175 |
| 2011/0227875 A1* | 9/2011 | Chung | G06F 3/0412 345/175 |
| 2015/0138224 A1* | 5/2015 | Kim | G02B 27/0172 345/592 |
| 2015/0255518 A1* | 9/2015 | Watanabe | H01L 27/1225 257/40 |
| 2015/0331508 A1 | 11/2015 | Nho et al. | |
| 2016/0093644 A1* | 3/2016 | Ki | H01L 29/78672 257/40 |
| 2016/0164030 A1* | 6/2016 | Yasuda | H01L 51/0097 349/122 |
| 2017/0255810 A1* | 9/2017 | Liu | G06F 3/0412 |

* cited by examiner

DISPLAY DEVICE

CROSS-REFERENCE TO RELATED APPLICATION

This U.S. application claims priority under 35 U.S.C. § 119 to Korean Patent Application No. 10-2016-0159634 filed on Nov. 28, 2016, the disclosure of which is incorporated by reference herein in its entirety.

TECHNICAL FIELD

The present inventive concept relates to a display device for recognizing a fingerprint of a user.

DISCUSSION OF THE RELATED ART

A display device may recognize a user's finger contacting a screen through a touch sensing unit. There are various types of touch sensing methods that may be performed by touch sensing units, such as a resistance film type method, an optical type method, an electrostatic capacitance type method, and an ultrasonic type method. Among them, the electrostatic capacitance type detects whether or not a touch occurs by using a capacitor and detecting a change of capacitance in the capacitor when a touch generating means (e.g., a finger) contacts the screen of the display device.

Personal mobile devices such as smart phones and tablet personal computers (PCs) utilize such display devices. As the mobile devices are increasingly used to store sensitive information, personal and financial, they require additional security.

SUMMARY

According to an exemplary embodiment of the present inventive concept, a display device includes a first base layer, a circuit layer disposed on the first base layer and including a plurality of switching elements, a pixel layer disposed on the circuit layer and including a light emitting element, wherein the light emitting element is configured to receive a current from at least one of the plurality of switching elements to emit a first light, and a sensor layer disposed below the first base layer and including a sensor, wherein the sensor is configured to receive a second light generated when the first light is reflected by an external object.

In an exemplary embodiment of the present inventive concept, the second light passes through the first base layer.

In an exemplary embodiment of the present inventive concept, the sensor layer further includes a second base layer where the sensor is mounted.

In an exemplary embodiment of the present inventive concept, the sensor includes a photodiode or a phototransistor.

In an exemplary embodiment of the present inventive concept, the sensor layer further includes an optical lens overlapping the sensor.

In an exemplary embodiment of the present inventive concept, the display device further includes an adhesive layer disposed between the first base layer and the sensor layer, and having an opening corresponding to the sensor.

In an exemplary embodiment of the present inventive concept, the display device further includes a touch sensing circuit disposed on the pixel layer.

In an exemplary embodiment of the present inventive concept, the external object is a fingerprint.

In an exemplary embodiment of the present inventive concept, the display device further includes a sensor control circuit configured to detect a change between the second light received by the sensor and the first light, wherein the detected change is used to recognize the fingerprint.

In an exemplary embodiment of the present inventive concept, the light emitting element is an organic light emitting diode (OLED).

According to an exemplary embodiment of the present inventive concept, a display device includes a base layer configured to transmit at least a part of incident light, a circuit layer disposed on the base layer and including a plurality of switching elements, a pixel layer disposed on the circuit layer and including a plurality of light emitting elements, wherein the light emitting element is configured to receive a current from the plurality of switching elements to emit light, and a sensor layer disposed below the base layer and including a first sensor configured to receive a light emitted from at least one of the plurality of light emitting elements and reflected by an external object. In an exemplary embodiment of the present inventive concept, the base layer comprises a material that is at least partially transparent.

In an exemplary embodiment of the present inventive concept, the external object is a fingerprint.

In an exemplary embodiment of the present inventive concept, the display device further includes a touch sensing circuit disposed on the pixel layer.

In an exemplary embodiment of the present inventive concept, the display device further includes a window member disposed on the touch sensing circuit.

In an exemplary embodiment of the present inventive concept, wherein the first sensor includes a transistor having a bottom gate structure.

In an exemplary embodiment of the present inventive concept, wherein a fingerprint contact area corresponds to where the fingerprint contacts the window member, and when the fingerprint contacts the window member, a white light is generated by light emitting elements overlapping the fingerprint contact area.

In an exemplary embodiment of the present inventive concept, the sensor layer further includes a second sensor adjacent to the first sensor, wherein the first and second sensors are spaced apart from each other, and a spacing distance between the first sensor and the second sensor is between about 20 μm and about 100 μm.

In an exemplary embodiment of the present inventive concept, the sensor layer further includes a plurality of optical lenses correspondingly disposed on the first and second sensors, respectively.

In an exemplary embodiment of the present inventive concept, the sensor layer further includes an adhesive layer, wherein the adhesive layer includes a plurality of openings corresponding to the first and second sensors.

According to an exemplary embodiment of the present inventive concept, a display device includes a base layer, a circuit layer disposed on the base layer and including a switching element, a pixel layer disposed on the circuit layer and including a first light emitting element connected to the switching element, wherein the first light emitting element is configured to emit a first light, and a sensor layer disposed below the circuit layer and including a sensor including a transistor configured to receive a second light that is generated when the first light is reflected due to a fingerprint.

In an exemplary embodiment of the present inventive concept, the display device further includes a touch sensing circuit disposed above the pixel layer, and a window member disposed on the touch sensing circuit.

In an exemplary embodiment of the present inventive concept, the display device further includes a second light emitting element, wherein when the fingerprint touches the window member, the second light emitting element emits a white light.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
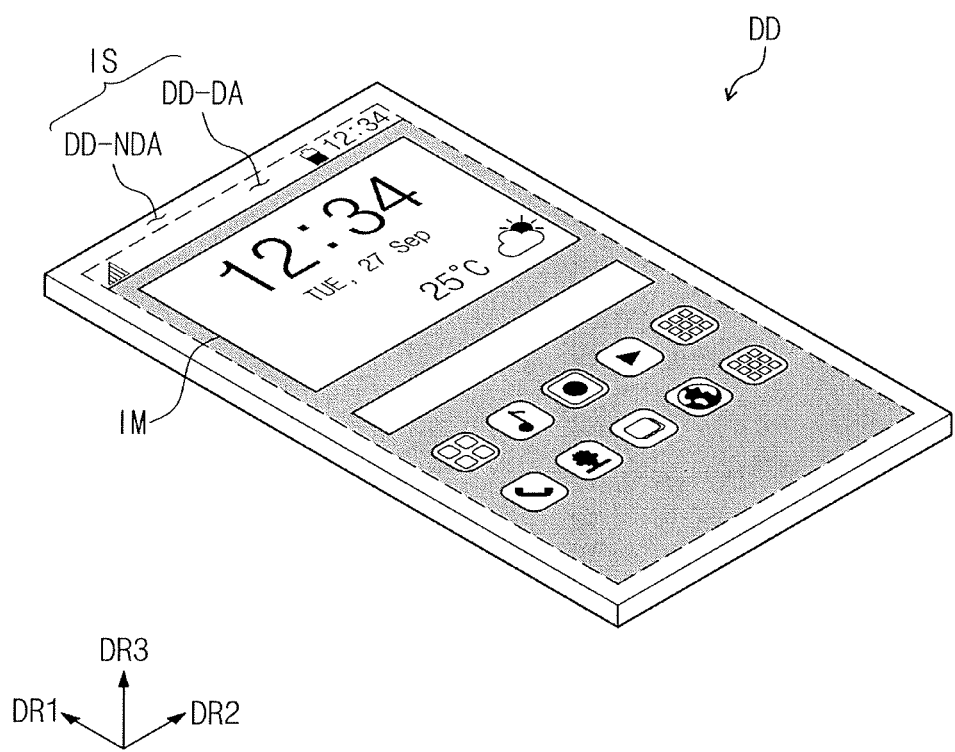
FIG. 1 is a perspective view of a display device according to an exemplary embodiment of the present inventive concept.

Exemplary embodiments of the present inventive concept will be described more fully hereinafter with reference to the accompanying drawings. It will be understood that when a component (or, an area, a layer, a part, etc.) is referred to as being "on", "connected to" or "combined to" another component, the component may be directly on, directly connected to, or directly combined to another component, or an intervening component may be present.

In the drawings, like reference numerals may refer to like elements. Additionally, in the drawings, the thicknesses, proportions, and dimensions of components may be exaggerated for clarity. In addition, singular expressions may include plural expressions unless the context clearly dictates otherwise.

Figure 2A:
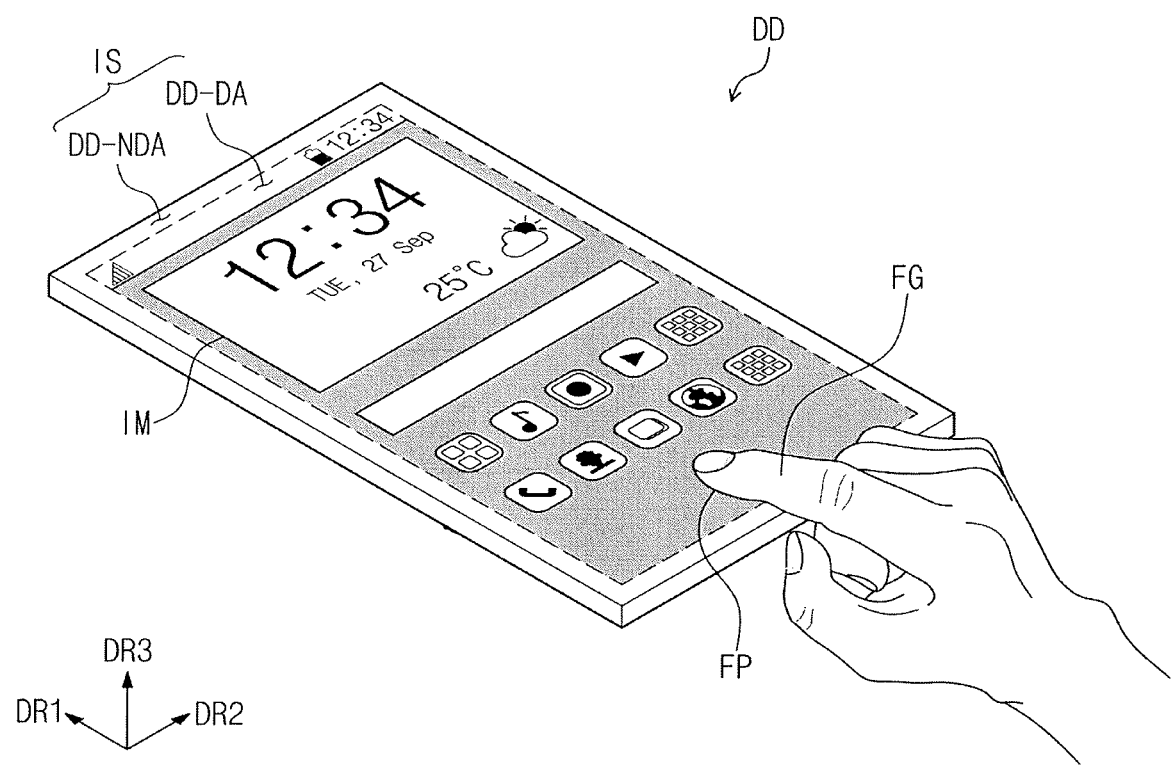
FIGS. 2A and 2B are perspective views illustrating that a user's finger contacts the display device shown in FIG. 1.
Figure 2B:
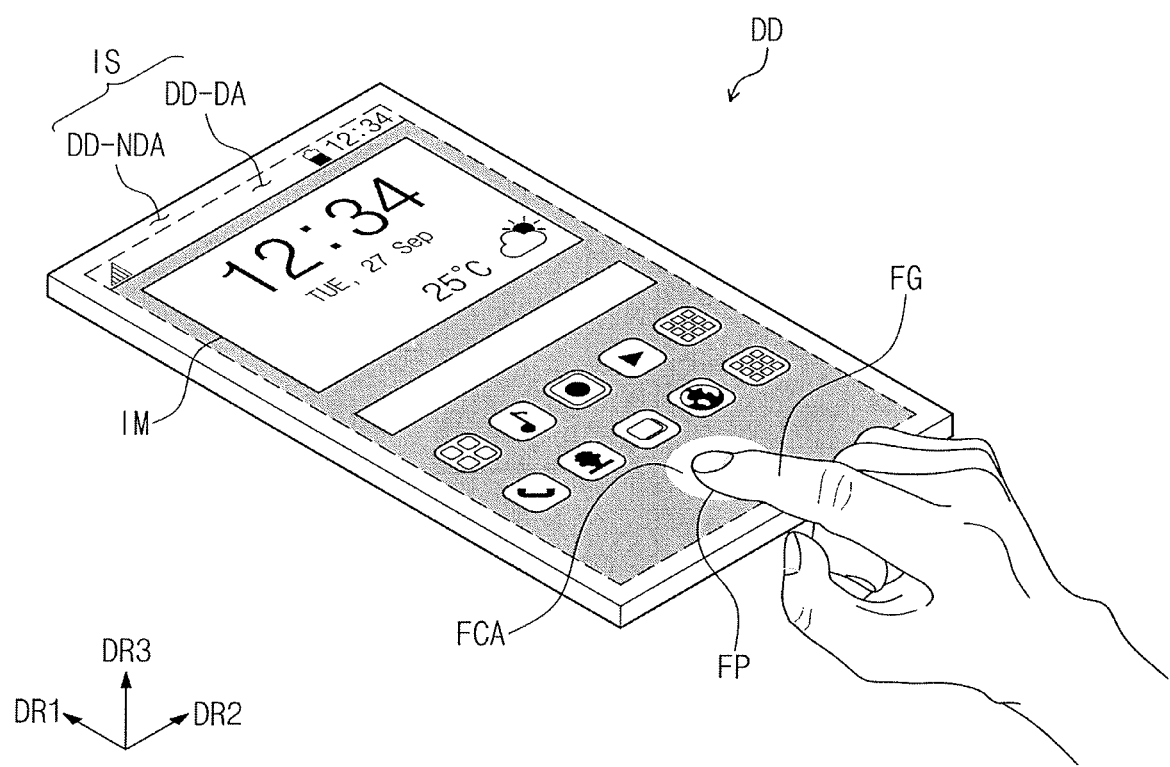

FIG. 1 is a perspective view of a display device DD according to an exemplary embodiment of the present inventive concept. FIGS. 2A and 2B are perspective views illustrating that a user's finger FG contacts the display device DD shown in FIG. 1.

A display surface IS that displays an image IM is a surface of the display device DD that extends in a first direction axis DR1 and a second direction axis DR2. The first direction axis DR1 crosses the second direction axis DR2. A third direction axis DR3 indicates a perpendicular direction of the display surface IS, that is, a thickness direction of the display device DD. A front surface (or, e.g., an upper surface) and a rear surface (or, e.g., a lower surface) of the display device are with respect to the third direction axis DR3. Hereinafter, first to third directions refer to the same reference numerals of the respective directions that the first to third direction axes DR1, DR2, and DR3 indicate.

The display device DD may be used for small and medium-sized electronic devices such as mobile phones, tablets, car navigation devices, game consoles, and smart watches in addition to large-sized electronic devices such as televisions and monitors.

Referring to FIG. 1, the display surface IS of the display device DD may include a plurality of areas. The display surface IS may include a display area DD-DA where an image IM is displayed and a non-display area DD-NDA adjacent to the display area DD-DA. The non-display area DD-NDA is an area where no image is displayed. FIG. 1 shows application icons as one example of the image IM. As one example, the display area DD-DA may have a rectangular form. The non-display area DD-NDA may surround the display area DD-DA. However, the present inventive concept is not limited thereto, and the non-display area DD-NDA may only partially surround the display area DD-DA.

Referring to FIG. 2A, the display device DD may recognize the fingerprint FP of the user's finger FG. According to an exemplary embodiment of the present inventive concept, an area where the fingerprint FP is recognizable may be located in the display area DD-DA. For example, when the fingerprint FP of the user's finger FG contacts the display area DD-DA, the display device DD may scan or detect the fingerprint FP of the user's finger FG.

The display device DD may recognize the user's fingerprint FP to determine whether the user is an authorized user of the display device DD. For example, the user's fingerprint FP may be used for mobile device security, financial transactions, system control, and the like.

According to an exemplary embodiment of the present inventive concept, only a portion of the display area DD-DA may recognize the fingerprint FP. According to an exemplary embodiment of the present inventive concept, the non-display area DD-NDA may recognize the fingerprint FP.

Referring to FIG. 2B, the area where the user's finger FG contacts the display area DD-DA may be a fingerprint contact area FCA. As the position where the finger FG contacts the display area DD-DA changes, the position of the fingerprint contact area FCA may change to an area corresponding thereto.

The light emitted from the fingerprint contact area FCA may be white. Since the white light has a higher reflectivity than light of the other colors, the recognition rate of the fingerprint FP by the display device DD may be increased when the fingerprint FP is recognized using the white light. For example, the emitted white light may form a white circular shape around the finger in the display area DD-DA.

Figure 3:
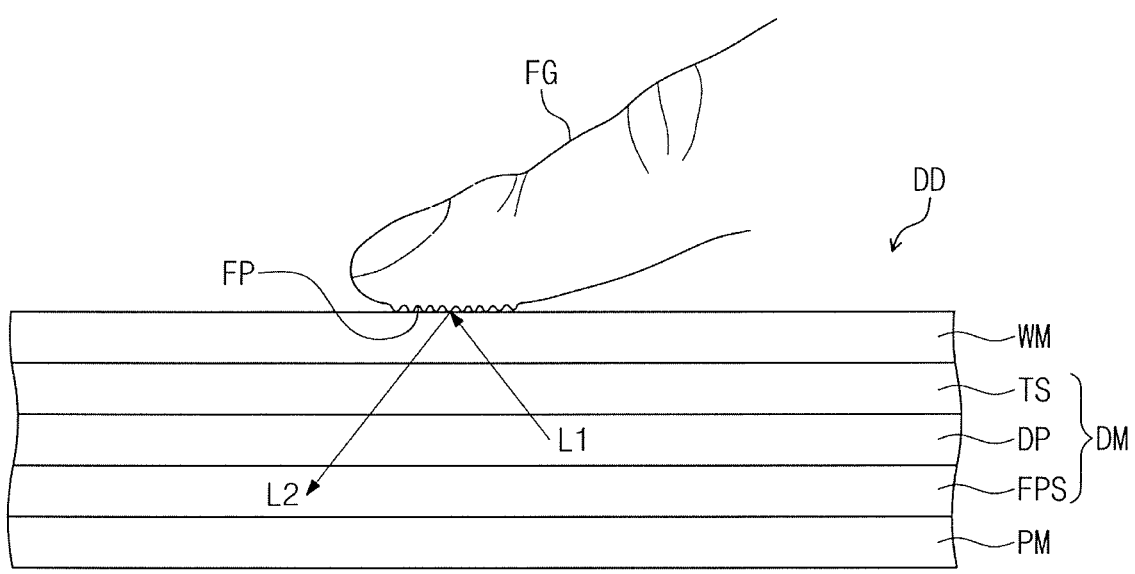
FIG. 3 is a view illustrating a portion of a section of the display device shown in FIG. 1.

FIG. 3 is a view illustrating a portion of a section of the display device DD shown in FIG. 1.

A protective film PM, a window WM (e.g., window member), and a display module DM are included in the display device DD. The display module DM is disposed between the protective film PM and the window WM. The display device DD may further include a first adhesive member and a second adhesive member. The first adhesive member may combine the display module DM and the protective film PM and the second adhesive member may combine the display module DM and the window WM. According to an exemplary embodiment of the present inventive concept, each of the protective film PM and the window WM may be formed continuously through a coating process.

According to an exemplary embodiment of the present inventive concept, each of the first adhesive member and the second adhesive member may be an Optically Clear Adhesive (OCA) film, an Optically Clear Resin (OCR), or a Pressure Sensitive Adhesive (PSA) film. According to an exemplary embodiment of the present inventive concept, each of the first adhesive member and the second adhesive member may include a light curing adhesive material or a thermosetting adhesive material. However, the material of the first and second adhesives is not limited thereto.

The protective film PM may protect the display module DM. The protective film PM may prevent external moisture from penetrating the display module DM and may absorb external impacts.

The protective film PM may include a plastic film as a base layer. The protective film PM may include a plastic film including one of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly (arylene ethersulfone), and a combination thereof.

A material constituting the protective film PM is not limited to plastic resins and may include an organic/inorganic composite material. The protective film PM may include an inorganic material filled in the pores of a porous organic layer, and an organic layer. The protective film PM may further include a functional layer formed at a plastic film. The functional layer may include a resin layer. The functional layer may be formed through a coating method.

The window WM may protect the display module DM from external impacts and may provide a touch sensing surface to a user. The display surface IS shown in FIGS. 1 to 2B may be a touch sensing surface for detecting whether the user is touching the display surface IS. Additionally, the display surface IS may be a fingerprint recognition surface for scanning or detecting a user's fingerprint.

According to an exemplary embodiment of the present inventive concept, the display module DM may include a display panel DP, a touch sensing circuit TS, and a sensor layer FPS.

The display panel DP includes a plurality of light emitting elements. The display panel DP generates the image IM (see, e.g., FIG. 1) corresponding to inputted image data. The process of forming the display panel DP may include Low Temperature Polycrystalline Silicon (LTPS) or Low Temperature Polycrystalline Oxide (LTPO) processes.

The touch sensing circuit TS is disposed on the display panel DP. The touch sensing circuit TS may obtain coordinate information of an external input (e.g., a finger FG contacting an area of the display surface IS). The touch sensing circuit TS may be directly disposed on one surface of the display panel DP. According to an exemplary embodiment of the present inventive concept, the touch sensing circuit TS may be manufactured with the display panel DP through a continuous process. However, the present inventive concept is not limited thereto. For example, the touch sensing circuit TS and the display panel DP may be manufactured separately from each other, and touch sensing circuit TS may be adhered to the display panel DP. In an exemplary embodiment of the present inventive concept, the touch sensing circuit TS may be disposed on a pixel layer ELL (see, e.g., FIG. 9).

According to an exemplary embodiment of the present inventive concept, the touch sensing circuit TS may be a single-layer type. For example, the touch sensing circuit TS may include a single conductive layer. Here, the single conductive layer may be a conductive layer classified as an insulation layer. A layer-stacked structure of a first metal layer, a second metal layer, and a metal oxide layer may correspond to a single conductive layer, and a layer-stacked structure of a first metal layer, an insulation layer, and a metal oxide layer may correspond to a double conductive layer. However, the present inventive concept is not limited thereto, and the touch sensing circuit TS may be a multilayer type including a plurality of conductive layers.

A plurality of touch sensors and a plurality of touch signal lines are formed by patterning a single conductive layer. For example, the touch sensors of the touch sensing circuit TS may be disposed on the same layer. The touch sensors may be disposed directly on the thin film sealing layer TFE (see, e.g., FIG. 9). In addition, a portion of each of the touch signal lines may be disposed on the same layer as the touch sensors.

According to an exemplary embodiment of the present inventive concept, the touch signal lines and the touch signal sensors may include indium tin oxide (ITO), indium zinc oxide (IZO), zinc oxide (ZnO), indium tin zinc oxide (ITZO), poly 3,4-ethylenedioxythiophene (PEDOT), metal nano wire, and/or graphene. According to an exemplary embodiment of the present inventive concept, the touch signal lines and the touch signal sensors may include a metal layer, for example, molybdenum, silver, titanium, copper, aluminum, or an alloy thereof. The touch signal lines and the touch signal sensors may include the same material or different materials.

The sensor layer FPS is disposed below the display panel DP. The sensor layer FPS may include a plurality of sensors SN (see, e.g., FIG. 6) for recognizing the fingerprint FP of the finger FG.

The light L1 (hereinafter referred to as a first light) emitted from a light emitting element in the display panel DP is incident to the peak or trough of the fingerprint FP. The light L2 (hereinafter referred to as a second light) reflected by the peak or trough of the fingerprint FP is incident on at least one of the sensors SN (see, e.g., FIG. 6) of the sensor layer FPS. The display device DD may recognize the user's fingerprint FP by using the first light L1 and the second light L2, and a detailed description thereof will be described later.

The display module DM according to an exemplary embodiment of the present inventive concept may further include an anti-reflective layer. The anti-reflective layer may include a color filter or a layer-stacked structure of a conductive layer, a dielectric layer, and a conductive layer. The anti-reflective layer may reduce external light reflectance by absorbing, destructive-interfering, or polarizing the light incident to the display surface IS from the outside.

Figure 4:
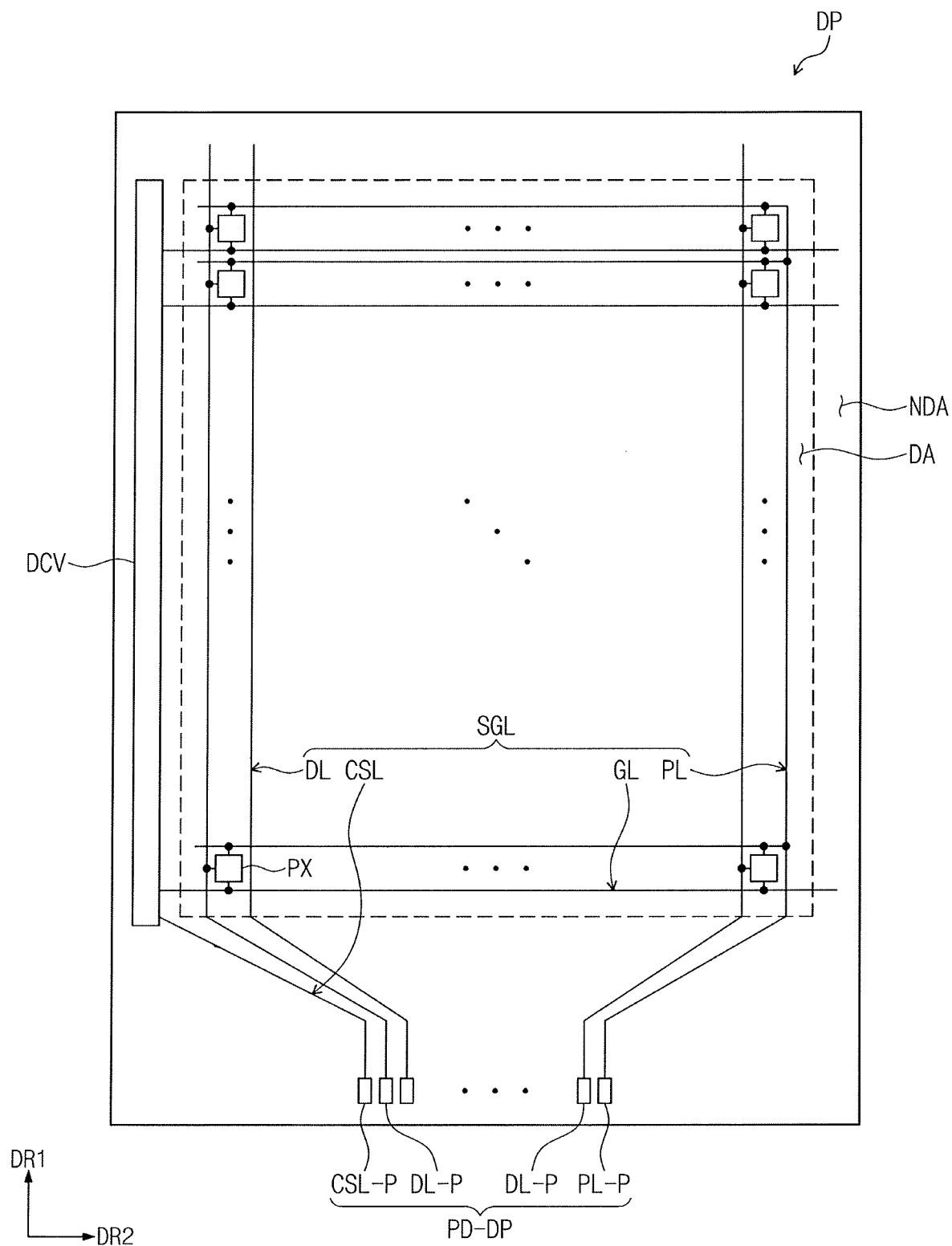
FIG. 4 is a plan view of a display panel according to an exemplary embodiment of the present inventive concept.

FIG. 4 is a plan view of a display panel DP according to an exemplary embodiment of the present inventive concept.

Figure 5:
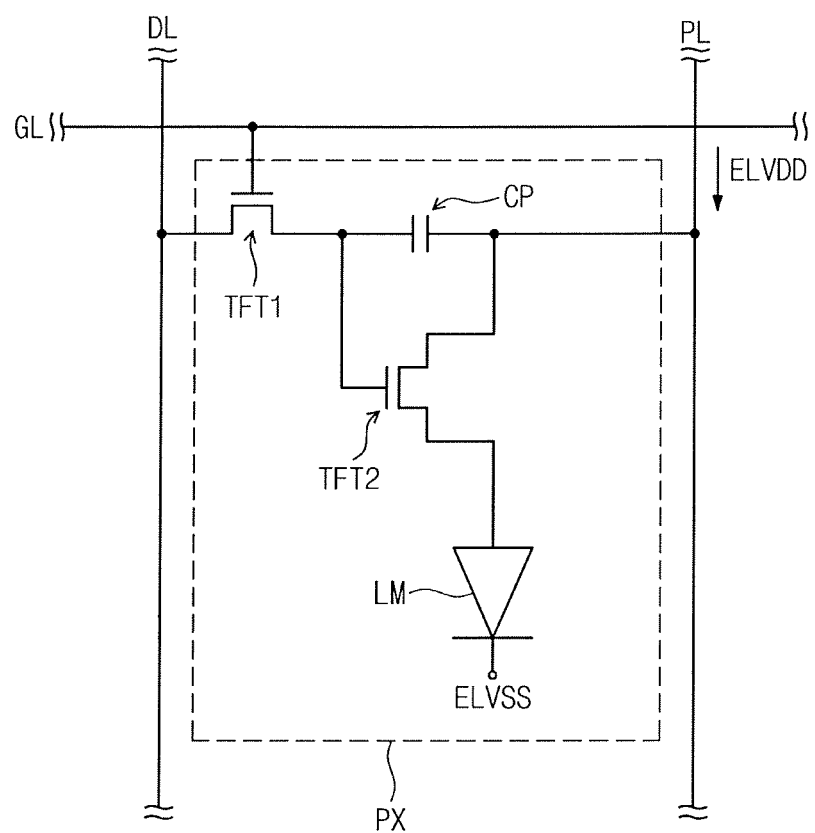
FIG. 5 is a circuit diagram of a pixel according to an exemplary embodiment of the present inventive concept.

FIG. 5 is a circuit diagram of a pixel PX according to an exemplary embodiment of the present inventive concept.

Referring to FIG. 4, the display panel DP includes a display area DA and a non-display area NDA on a plane. The display area DA and the non-display area NDA of the display panel DP correspond to the display area DD-DA (see, e.g., FIG. 1) and the non-display area DD-NDA (see, e.g., FIG. 1) of the display device DD (see, e.g., FIG. 1), respectively. The display area DA and the non-display area NDA of the display panel DP might not be identical to the display area DD-DA and the non-display area DD-NDA of the display device DD, and the display panel DP may vary according to a structure/design of the display panel DP.

The display panel DP includes a plurality of signal lines SGL and a plurality of pixels PX. The plurality of pixels PX may be disposed in the display area DA. In this embodiment, the non-display area NDA may be a peripheral area surrounding the display area DA.

The plurality of signal lines SGL includes gate lines GL, data lines DL, a power line PL, and a control signal line CSL. The gate lines GL are respectively connected to corresponding pixels PX among the plurality of pixels PX, and the data lines DL are respectively connected to corresponding pixels PX among the plurality of pixels PX. The power line PL is connected to the plurality of pixels PX. A gate driving circuit DCV connected to the gate lines GL may be disposed at one side of the non-display area NDA. The control signal line CSL may provide control signals to the gate driving circuit DCV.

Some of the gate lines GL, the data lines DL, the power line PL, and the control signal line CSL may be disposed on the same layer and some of them may be disposed on different layers. Signal lines arranged on any one layer, of the gate lines GL, the data lines DL, the power line PL, and the control signal line CSL may be considered first signal lines. Signal lines disposed on another layer may be considered second signal lines. Signal lines disposed on yet another layer may be considered third signal lines.

Each of the gate lines GL, the data lines DL, the power line PL, and the control signal line CSL include a signal wiring part and display panel pads PD-DP connected to an end of the signal wiring part. The signal wiring part may be a portion excluding the display panel pads PD-DP of the gate lines GL, the data lines DL, the power line PL, and the control signal line CSL.

The display panel pads PD-DP may be formed through the same process as transistors for driving the pixels PX. For example, the display panel pads PD-DP may be formed through a Low Temperature Polycrystalline Silicon (LTPS) process or a Low Temperature Polycrystalline Oxide (LTPO) process.

According to an exemplary embodiment of the present inventive concept, the display panel pads PD-DP may include a control pad CSL-P, a data pad DL-P, and a power pad PL-P. A gate pad part may overlap the gate driving circuit DCV and may be connected thereto. A portion of the non-display area NDA, where the control pad CSL-P, the data pad DL-P, and the power source pad PL-P are aligned, may be referred to as a pad area. As described later, the pads of the touch sensing circuit TS (see, e.g., FIG. 3) may be disposed adjacent to the pads of the display panel DP described above.

FIG. 5 is an example of a pixel PX connected to any one gate line GL, any one data line DL, and the power line PL. However, a configuration of the pixel PX is not limited thereto and may be modified.

The pixel PX includes a light emitting element LM as a display element. The light emitting element LM may be a top light emission type diode or a bottom light emission type diode. In addition, the light emitting element LM may be a double-sided light emission type diode. The light emitting element LM may be an organic light emitting diode. The pixel PX includes a first transistor TFT1 (or, e.g., a switching transistor), a second transistor TFT2 (or, e.g., a driving transistor), and a capacitor CP, as a circuit for driving the light emitting element LM. The light emitting element LM generates light by electrical signals provided from the first and second transistors TFT1 and TFT2.

The first transistor TFT1 outputs a data signal applied to the data line DL in response to a scan signal applied to the gate line GL. The capacitor CP charges a voltage corresponding to a data signal received from the first transistor TFT1.

The second transistor TFT2 is connected to the light emitting element LM. The second transistor TFT2 controls a driving current flowing through the light emitting element LM in correspondence to a charge amount stored in the capacitor CP. The light emitting element LM may emit light during a turn-on state of the second transistor TFT2.

In addition, the pixel PX receives a first voltage ELVDD through the power line PL. Further, the power line PL is connected to the second transistor TFT2. The pixel also receives a second voltage ELVSS.

Figure 6:
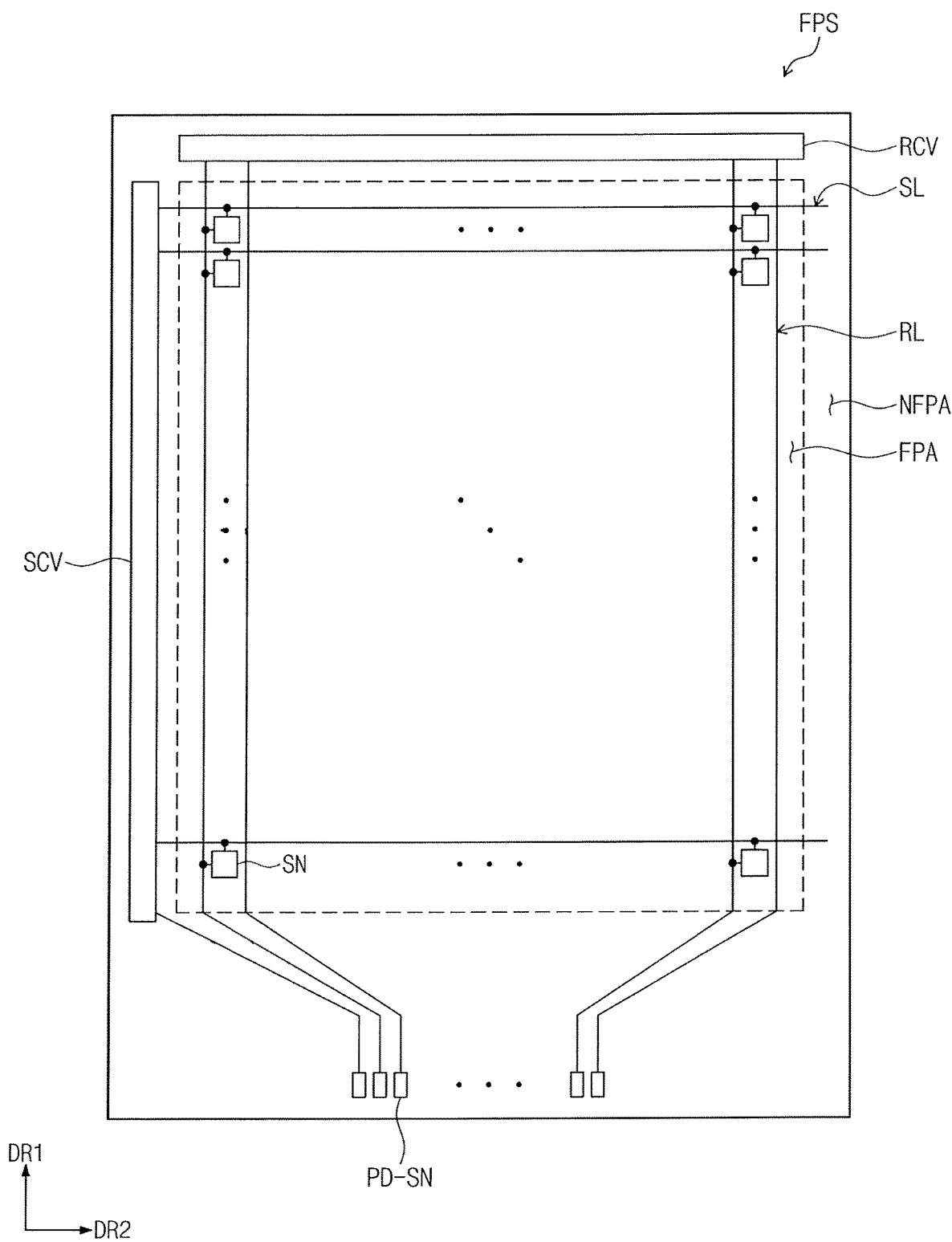
FIG. 6 is a plan view of a sensor layer according to an exemplary embodiment of the present inventive concept.
Figure 7:
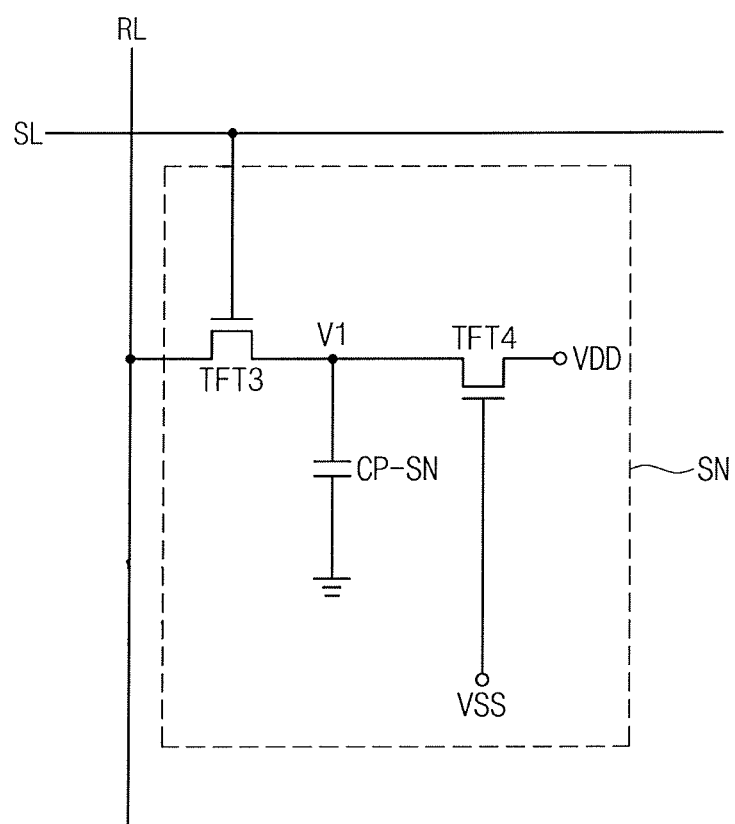
FIG. 7 is a circuit diagram of a sensor according to an exemplary embodiment of the present inventive concept.

FIG. 6 is a plan view of a sensor layer FPS according to an exemplary embodiment of the present inventive concept. FIG. 7 is an equivalent circuit diagram of a sensor SN according to an exemplary embodiment of the present inventive concept.

Referring to FIG. 6, a sensor layer FPS includes a fingerprint recognition area FPA and a non-recognition area NFPA on a plane. The fingerprint recognition area FPA and the non-fingerprint recognition area NFPA of the sensor layer FPS may correspond to the display area DD-DA (see, e.g., FIG. 1) and the non-display area DD-NDA (see, e.g., FIG. 1) of the display device DD (see, e.g., FIG. 1), respectively. The fingerprint recognition area FPA and the non-fingerprint recognition area NFPA of the sensor layer FPS might not be identical to the display area DD-DA and the non-display area DD-NDA of the display area DD, and may vary according to a structure/design of the sensor layer FPS.

The sensor layer FPS includes a plurality of scan lines SL, a plurality of lead-out lines RL, and a plurality of sensors SN. The plurality of sensors SN may be arranged on a fingerprint recognition area FPA.

The scan lines SL are respectively connected to corresponding sensors SN among the plurality of sensors SN, and the lead-out lines RL are respectively connected to corresponding sensors SN among the plurality of sensors SN.

The spacing distance between adjacent sensors SN among the plurality of sensors SN may be about 3 μm or more and about 120 μm or less. The spacing distance between the sensors SN may be about 20 μm or more and about 100 μm or less. If the spacing distance between the sensors SN is greater than 100 μm, it might not be possible to obtain a scan image having a sufficient resolution for recognizing a fingerprint FP. If the spacing distance is less than 20 μm, the process for recognizing a fingerprint FP may become complicated and the manufacturing cost may increase.

A scan driver circuit SCV connected to the scan lines SL may be disposed at one side of the non-fingerprint recognition area NFPA. In an exemplary embodiment of the present inventive concept, the scan driving circuit SCV may be identical to the gate driving circuit DCV (see, e.g., FIG. 4).

A lead-out circuit RCV connected to the lead-out lines RL may be disposed at one side of the non-fingerprint recognition area NFPA. In an exemplary embodiment of the present inventive concept, a signal applied from an external integrated circuit may be applied to the lead-out lines RL without the lead-out circuit RCV.

Each of the scan lines SL and the lead-out lines RL may include sensor pads PD-SN connected to one of their ends.

The sensor pads PD-SN may be formed through the same process as the transistors for driving the sensors SN. For example, the sensor pads PD-SN may be formed through a Low Temperature Polycrystalline Silicon (LTPS) process or a Low Temperature Polycrystalline Oxide (LTPO) process.

Scan signals may be sequentially supplied to the scan lines SL, and the lead-out lines RL may receive signals outputted from the sensors SN and deliver the signals to the lead-out circuit RCV. In an exemplary embodiment of the present inventive concept, signals outputted from the sensor SN may be delivered to another circuit that processes the signals.

FIG. 7 is an example of the sensor SN connected to one scan line SL and one lead-out line RL. A configuration of the sensor SN is not limited thereto and may be modified.

The sensor SN may include a third transistor TFT3, a fourth transistor TFT4, and a sensing capacitor CP-SN.

In relation to the third transistor TFT3 as a switching element, the control electrode of the third transistor TFT3 is connected to the scan line SL, the output electrode of the third transistor TFT3 is connected to the lead-out line RL, and the input electrode of the third transistor TFT3 is connected to the sensing capacitor CP-SN. In addition, the input electrode of the fourth transistor TFT4 is connected to an input voltage line VDD, the output electrode of the fourth transistor TFT4 is connected to the sensing capacitor CP-SN, and the control electrode of the fourth transistor TFT4 is connected to a common voltage line VSS.

When the light reflected from an external object is supplied to the fourth transistor TFT4, since a semiconductor of a channel part formed of amorphous silicon or polycrystalline silicon forms a current, the current may flow toward the sensing capacitor CP-CN and the third transistor TFT3 by an input voltage inputted to the input voltage line VDD. For example, the fourth transistor TFT4 is a phototransistor. A phototransistor, as a type of optical sensor that converts light energy into electrical energy, uses a photovoltaic effect that a produces a current based on the intensity of light. A phototransistor amplifies a photocurrent at this time by using a transistor.

When a selection signal is inputted to the scan line SL, the current flows through the lead-out line RL.

According to an exemplary embodiment of the present inventive concept, the number of pixels PX and the number of sensors SN may be different from each other. The number of sensors SN may be smaller than the number of pixels PX, but the present inventive concept is not limited thereto.

Figure 8:
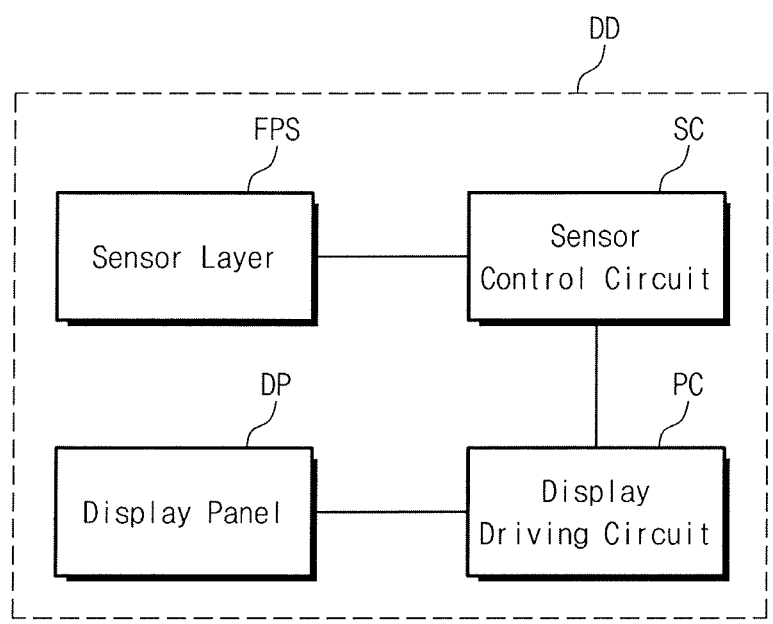
FIG. 8 is a block diagram of a display device according to an exemplary embodiment of the present inventive concept.

FIG. 8 is a block diagram of a display device DD according to an exemplary embodiment of the present inventive concept. Referring to FIG. 8, the display device DD according to an exemplary embodiment of the present inventive concept may further include a sensor control circuit SC and a display drive circuit PC.

The sensor control circuit SC may control the operation of the sensor layer FPS and may recognize the fingerprint FP of a user by detecting a light change amount when light is received by the sensor layer FPS. For example, the light change amount may correspond to a difference between a light (e.g., the first light L1), which is incident to the fingerprint FP and generated by a light emitting element LM, and a reflected light (e.g., the second light L2), which is reflected from the fingerprint FP to the sensor layer FPS. In addition, the sensor control circuit SC is connected to the sensor layer FPS.

The display driving circuit PC may control an image display operation of the display panel DP by supplying an image driving signal to the display panel DP. For this, the display driving circuit PC may generate an image driving signal by using image data and control signals supplied from an external device. For example, the display driving circuit PC may receive image data and control signals from a host, and the control signals may include a vertical synchronization signal, a horizontal synchronization signal, and a main clock signal. In addition, the image driving signal may include a scan signal and a data signal generated from image data.

The sensor control circuit SC and the display driving circuit PC may be integrated into one configuration. For example, the sensor control circuit SC and the display driving circuit PC may be implemented as an integrated circuit (IC).

Figure 9:
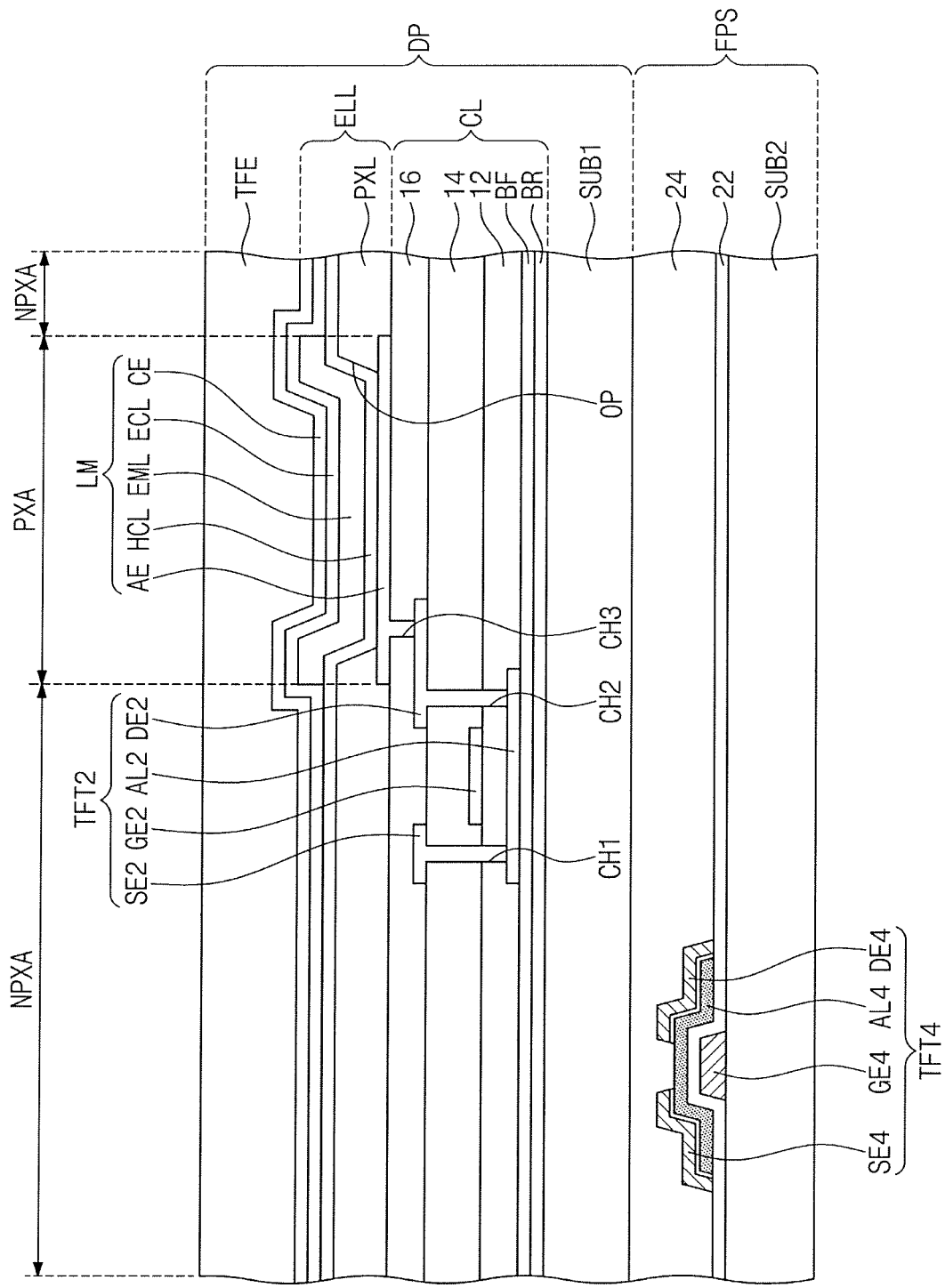
FIG. 9 is a partial cross-sectional view of a display panel and a sensor layer according to an exemplary embodiment of the present inventive concept.

FIG. 9 is a partial cross-sectional view of a display panel DP and a sensor layer FPS according to an exemplary embodiment of the present inventive concept. For example, FIG. 9 shows partial cross-sections corresponding to the second transistor TFT2, the fourth transistor TFT4, and the light emitting element LM shown in FIGS. 5 and 7.

The display panel DP includes a first base layer SUB1, a circuit layer CL, a pixel layer ELL, and a thin-film sealing layer TFE.

The first base layer SUB1 may include an organic material or an inorganic material. For example, the first base layer SUB1 may be a transparent material or at least a partially transparent material. The first base layer SUB1 may transmit (e.g., allow to pass through) at least part of the second light L2 reflected from the fingerprint FP of the user. For example, the second light L2 may pass through the first base layer SUB1.

The circuit layer CL is disposed on the first base layer SUB1. A semiconductor pattern AL2 (hereinafter referred to as a second semiconductor pattern) of the second transistor TFT2 is disposed on the first base layer SUB1. The material of the second semiconductor pattern AL2 may be selected from amorphous silicon, polysilicon, and metal oxide semiconductors.

The circuit layer CL may include organic/inorganic layers BR, BF, 12, 14, 16 and the second transistor TFT2. The organic/inorganic layers BR, BF, 12, 14 may include functional layers BR and BF, a first insulation layer 12, a second insulation layer 14, and a third insulation layer 16. The circuit layer CL may include the first transistor TFT1 (see, e.g., FIG. 5) and the capacitor CP (see, e.g., FIG. 5).

The functional layers BR and BF may be disposed on one surface of the first base layer SUB1. The function layers BR and BF include at least one of a barrier layer BR and a buffer layer BF. The second semiconductor pattern AL2 may be disposed on the barrier layer BR or the buffer layer BF.

The first insulation layer 12 covers the second semiconductor pattern AL2 and is disposed on the first base layer SUB1. The first insulation layer 12 may include an organic layer and/or an inorganic layer. The first insulation layer 12 may include a plurality of inorganic thin films. The plurality of inorganic thin films may include a silicon nitride layer, a silicon oxynitride layer, and a silicon oxide layer.

A control electrode GE2 (hereinafter referred to as a second control electrode) of the second transistor TFT2 is disposed on the first insulation layer 12. The second control electrode GE2 may be manufactured through the same photolithography process as the gate line GL (see, e.g., FIG. 5). For example, the second control electrode GE2 may be formed of the same material, may have the same layer-stacked structure, and may be disposed on the same layer as the gate lines GL.

The second insulation layer 14 covering the second control electrode GE2 is disposed on the first insulation layer 12. The second insulation layer 14 may include an organic layer and/or an inorganic layer. The second insulation layer 14 may include a plurality of inorganic thin films. The plurality of inorganic thin films may include a silicon nitride layer, a silicon oxynitride layer, and/or a silicon oxide layer.

An input electrode SE2 (hereafter referred to as a second input electrode) and an output electrode DE2 (hereinafter referred to as a second output electrode) of the second transistor TFT2 are disposed on the second insulation layer 14. The second input electrode SE2 may be branched from the power line PL (see, e.g., FIG. 5).

The second input electrode SE2 and the second output electrode DE2 may be manufactured according to the same photolithography process, may be formed of the same material, may have the same layer-stacked structure, and may be disposed on the same layer as those of the data lines DL (see, e.g., FIG. 5) and as those of the power line PL (see, e.g., FIG. 5).

The second input electrode SE2 and the second output electrode DE2 are connected to the second semiconductor pattern AL2 through a first through hole CH1 and a second through hole CH2, respectively, penetrating the first insulation layer 12 and the second insulation layer 14. In addition, according to an exemplary embodiment of the present inventive concept, the second transistor TFT2 may be modified to be a bottom gate structure and to be implemented as such.

The third insulation layer 16 covering the second output electrode DE2 and the second input electrode SE2 may be disposed on the second insulation layer 14. The third insulation layer 16 may include an organic layer and/or an inorganic layer. The third insulation layer 16 may include an organic material for providing a flat surface.

One of the first insulation layer 12, the second insulation layer 14, and the third insulation layer 16 may be omitted according to a circuit structure of a pixel PX. Each of the second insulation layer 14 and the third insulation layer 16 may be referred to as an interlayer insulation layer. The interlayer insulation layer is disposed between a conductive pattern disposed at a lower part and a conductive pattern disposed at an upper part so that the interlayer insulation layer may insulate the conductive patterns from each other.

The pixel layer ELL is disposed on the third insulation layer 16. The pixel layer ELL includes a pixel definition layer PXL and a light emitting element LM. An anode AE is disposed on the third insulation layer 16. The anode AE is connected to the second output electrode DE2 through a third through hole CH3 penetrating the third insulation layer 16. The pixel definition layer PXL is disposed on the third insulation layer 16 and includes an opening OP corresponding to the anode AE. The opening OP of the pixel definition layer PXL exposes at least a part of the anode AE.

The pixel layer ELL includes a light emitting area PXA and a non-light emitting area NPXA adjacent to the light emitting area PXA. The non-light emitting area NPXA may surround the light emitting area PXA. According to this embodiment, the light emitting area PXA corresponds to the anode AE. However, the light emitting area PXA is not limited thereto. For example, the light emitting region PXA may correspond to an area where light is generated and not the anode AE. The light emitting area PXA may correspond to a partial area of the anode AE that is exposed by the opening OP.

A hole control layer HCL may be disposed in the light emitting area PXA and the non-light emitting area NPXA. A common layer such as the hole control layer HCL may be commonly formed in the plurality of pixels PX (see, e.g., FIG. 4).

A light emitting layer EML is disposed on the hole control layer HCL. The light emitting layer EML may be disposed in an area corresponding to the opening OP of the pixel definition layer PXL. In other words, the light emitting layer EML may be divided and formed at each of the plurality of pixels PX.

The light emitting layer EML may include an organic material and/or an inorganic material.

An electronic control layer ECL is disposed on the light emitting layer EML. A cathode CE is disposed on the electronic control layer ECL. The cathode CE is commonly disposed at the plurality of pixels PX.

Although the patterned light emitting layer EML is shown according to this embodiment as being disposed in a single pixel PX, the light emitting layer EML may be disposed in the plurality of pixels PX.

According to an exemplary embodiment of the present inventive concept, the light emitting layer EML may generate at least one of a blue light, a red light, and a green light. In an exemplary embodiment of the present inventive concept, the light emitting layer EML may generate a white light. Additionally, the light emitting layer EML may have a multilayer structure.

According to an exemplary embodiment of the present inventive concept, the thin film sealing layer TFE may directly cover the cathode CE. In an exemplary embodiment of the present inventive concept, the thin film sealing layer TFE may be disposed on the pixel layer ELL through an additional adhesive.

According to an exemplary embodiment of the present inventive concept, a capping layer for covering the cathode CE may be disposed above the cathode CE. Further, the thin film sealing layer TFE may cover the capping layer. The thin film sealing layer TFE may include an organic layer including an organic material and an inorganic layer including an inorganic material.

The sensor layer FPS is disposed below the display panel DP. The sensor layer FPS may include a second base layer SUB2, a fourth transistor TFT4, a fourth insulation layer 22, and a fifth insulation layer 24.

The second base layer SUB2 may include an organic material or an inorganic material. According to an exemplary embodiment of the present inventive concept, the second base layer SUB2 may be a film including polyimide. In an exemplary embodiment of the present inventive concept, the second base layer SUB2 may be a thin film including glass.

A control electrode GE4 (hereinafter referred to as a fourth control electrode) of the fourth transistor TFT4 is disposed on the second base layer SUB2.

The fourth insulation layer 22 covers the fourth control electrode GE4 and is disposed on the second base layer SUB2. The fourth insulation layer 22 may include an organic layer and/or an inorganic layer. The fourth insulation layer 22 may include a plurality of inorganic thin films. The plurality of inorganic thin films may include a silicon nitride layer, a silicon oxynitride layer, and/or a silicon oxide layer.

A semiconductor pattern AL4 (hereinafter referred to as a fourth semiconductor pattern) of the fourth transistor TFT4 is disposed on the fourth insulation layer 22. The material of the fourth semiconductor pattern AL4 may be selected from amorphous silicon, polysilicon, and metal oxide semiconductors.

Each of an input electrode SE4 (hereafter referred to as a fourth input electrode) and an output electrode DE4 (hereinafter referred to as a fourth output electrode) of the fourth transistor TFT4 is disposed to overlap a portion of the fourth semiconductor pattern AL2.

A fifth insulation layer 24 for covering the fourth input electrode SE4 and the fourth output electrode DE4 is disposed on the fourth insulation layer 22. The fifth insulation layer 24 may include an organic layer and/or an inorganic layer. The fifth insulation layer 24 may include a plurality of inorganic thin films. The plurality of inorganic thin films may include a silicon nitride layer, a silicon oxynitride layer, and/or a silicon oxide layer. According to an exemplary embodiment of the present inventive concept, the fifth insulation layer 24 may be directly disposed on the lower surface of the first base layer SUB1. According to an exemplary embodiment of the present inventive concept, the fifth insulation layer 24 may be adhered to the first base layer SUB1 by an adhesive member. According to an exemplary embodiment of the present inventive concept, when the display panel DP and the sensor layer FPS are manufactured through separate processes and are combined with each other through an adhesion process, the efficiency of the manufacturing process is increased.

Referring to FIGS. 3 and 9, the first light L1 generated by the light emitting element LM is reflected by the fingerprint FP of the finger FG so that the first light L1 becomes the second light L2 when reflected. The second light L2 may pass through each layer of the display panel DP and reach the fourth semiconductor pattern AL4 of the fourth transistor TFT4. The fourth transistor TFT4 detects a change between the first light L1 and the second light L2 and recognizes the fingerprint FP. The fourth transistor TFT4 may have a bottom gate structure, as shown in FIG. 9, to detect the change between the first light L1 and the second light L2 through the fourth semiconductor pattern AL4.

According to an exemplary embodiment of the present inventive concept, a portion of a plurality of layers disposed on the fourth transistor TFT4, which overlaps the fourth transistor TFT4, may be partially removed to increase the transmittance of the second light L2 to the fourth transistor TFT4.

Figure 10:
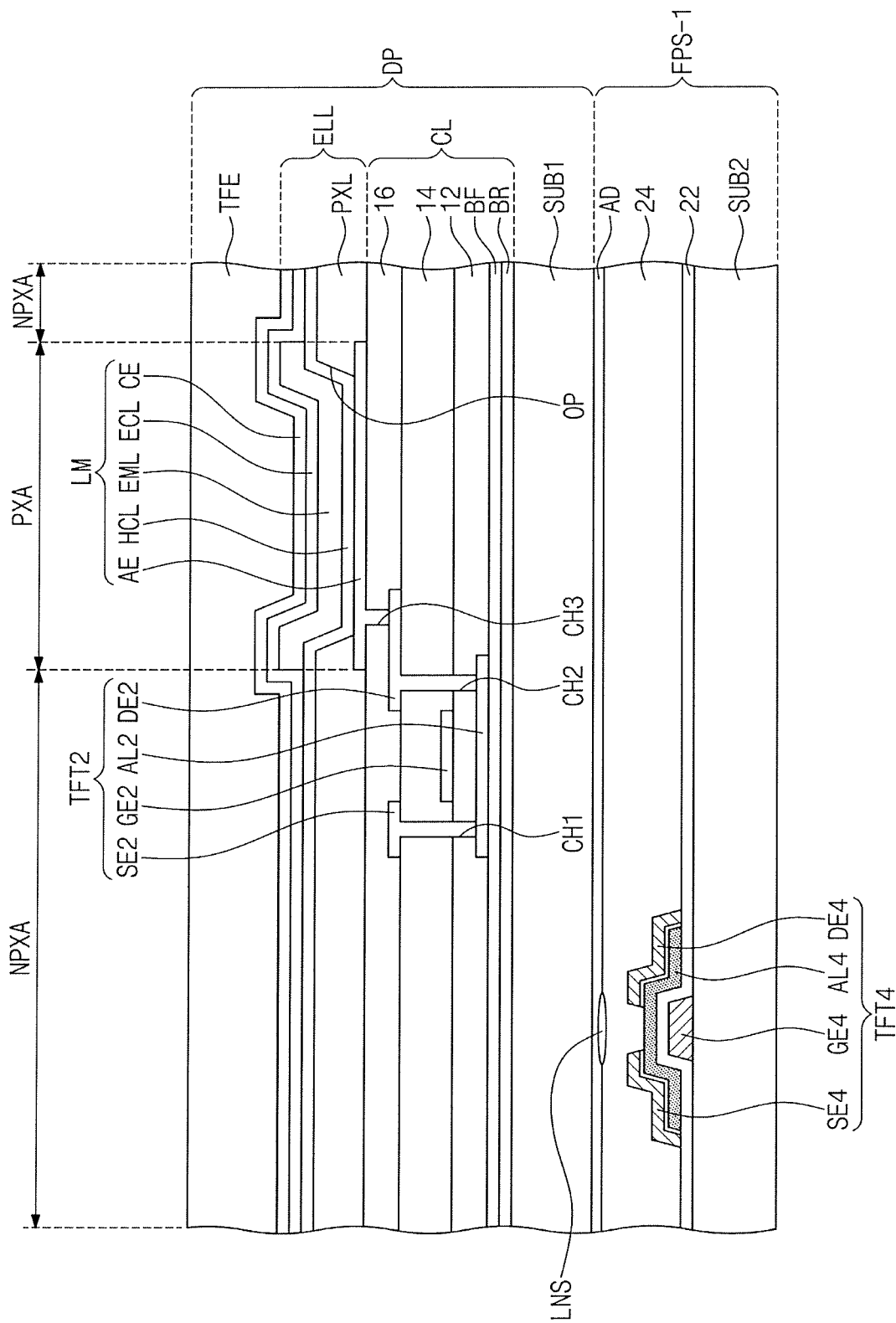
FIG. 10 is a partial cross-sectional view of a display panel and a sensor layer according to an exemplary embodiment of the present inventive concept.

FIG. 10 is a partial cross-sectional view of a display panel DP and a sensor layer FPS-1 according to an exemplary embodiment of the present inventive concept.

The sensor layer FPS-1 may include an optical lens LNS disposed on the fourth semiconductor pattern AL4 of the fourth transistor TFT4. The optical lens LNS condenses the second light L2 (see, e.g., FIG. 3) so that the second light L2 is applied to the fourth semiconductor pattern AL4 of the fourth transistor TFT4 and not a semiconductor pattern of an adjacent transistor. By using the optical lens LNS, the resolution for scanning a fingerprint may be increased.

The sensor layer FPS-1 may include an adhesive member AD covering the optical lens LNS. The sensor layer FPS-1 and the display panel DP may be bonded to each other by the adhesive member AD. Descriptions of other elements that are substantially the same as those described with reference to FIG. 9 may be omitted.

Figure 11:
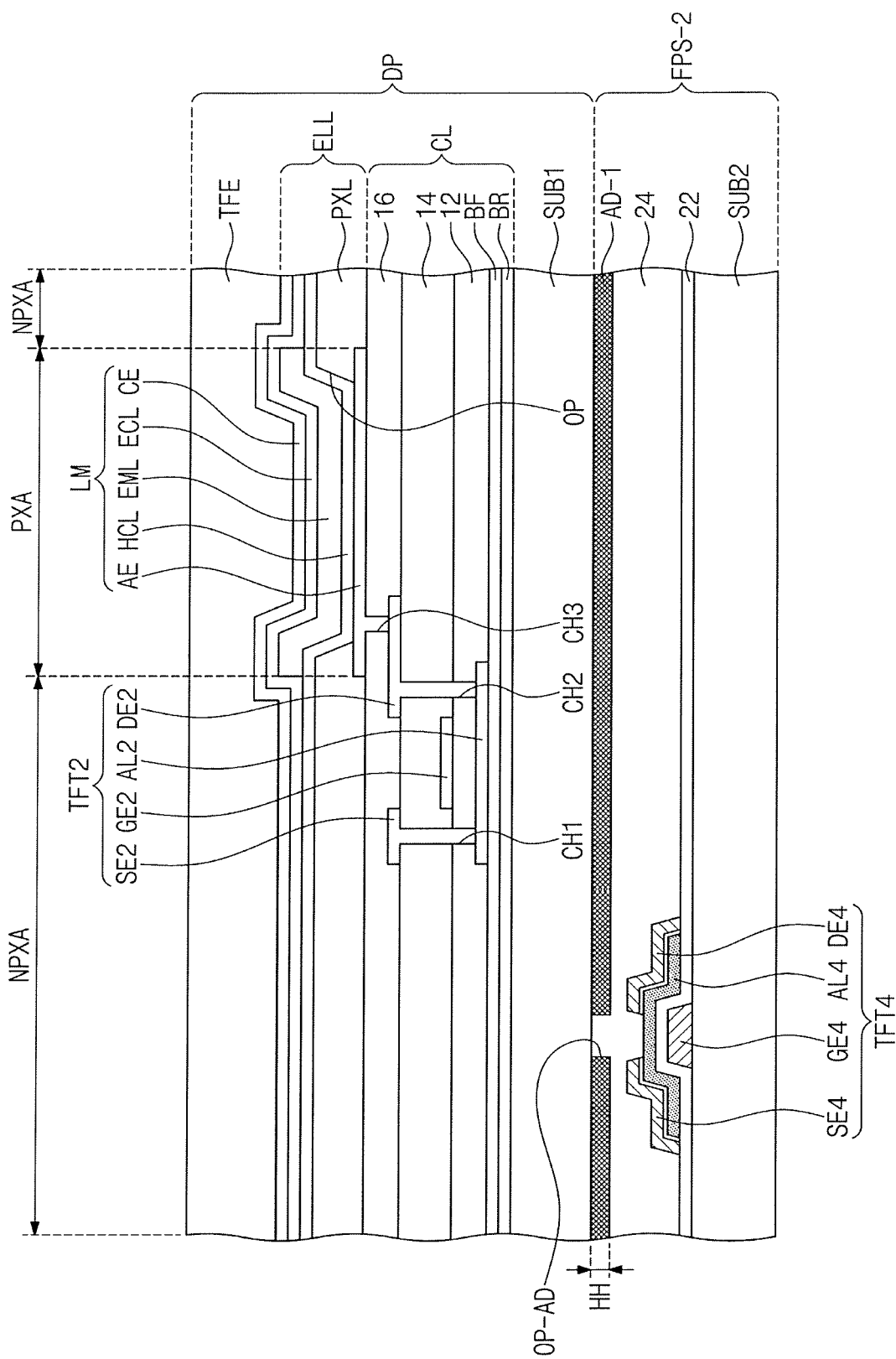
FIG. 11 is a partial cross-sectional view of a display panel and a sensor layer according to an exemplary embodiment of the present inventive concept.

FIG. 11 is a partial cross-sectional view of a display panel DP and a sensor layer FPS-2 according to an exemplary embodiment of the present inventive concept.

The sensor layer FPS-2 may include an adhesive member AD-1 (e.g., an adhesive layer) disposed on the fifth insulating layer 24. An opening OP-AD corresponding to the fourth transistor TFT4 of the sensor SN (see, e.g., FIG. 7) may be included in the adhesive member AD-1.

According to an exemplary embodiment of the present inventive concept, an area of the adhesive member OP-AD, other than the area where the opening OP-AD of the bonding member AD-1 is located, might not transmit light. However, the inventive concept is not limited thereto.

The adhesive member AD-1 has a predetermined thickness HH. The opening OP-AD of the adhesive member AD-1 may serve a similar function to that of the optical lens LNS of FIG. 10. In other words, due to the opening OP-AD of the adhesive member AD-1 and the predetermined thickness HH, the probability that the second light L2 (see, e.g., FIG. 3) is applied to the fourth semiconductor pattern AL4 of the fourth transistor TFT4 and not a semiconductor pattern of another adjacent transistor may be increased. Descriptions of other elements that are substantially the same as those described with reference to FIG. 9 may be omitted.

Figure 12:
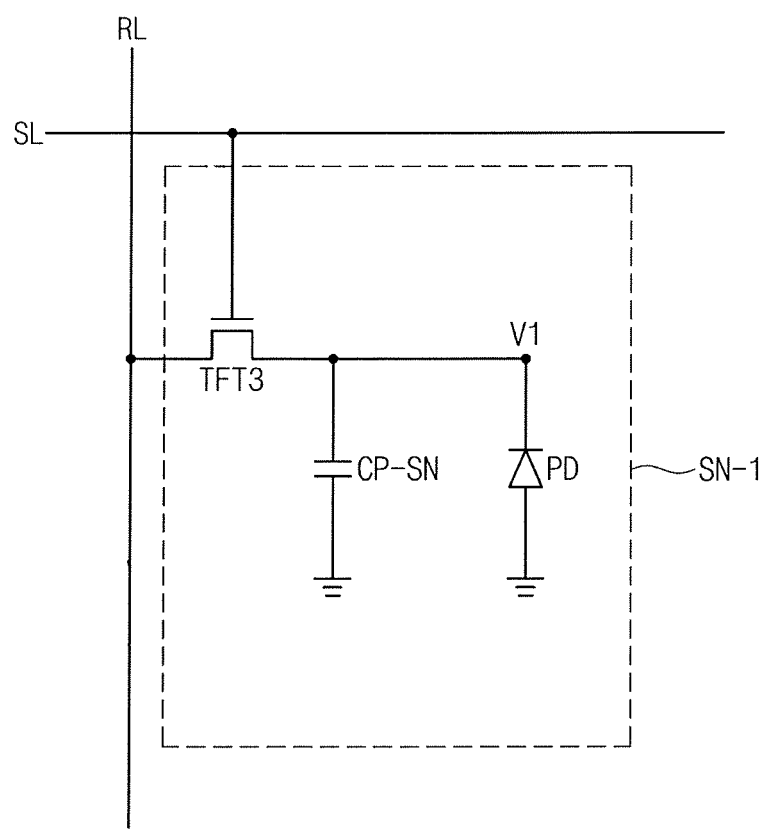
FIG. 12 is a circuit diagram of a sensor according to an exemplary embodiment of the present inventive concept.

FIG. 12 is a circuit diagram of a sensor SN-1 according to an exemplary embodiment of the present inventive concept.

The sensor SN-1 may include a third transistor TFT3, a sensing capacitor CP-SN, and a photodiode PD.

The photodiode PD may serve as the fourth transistor TFT4 of FIG. 7 instead. In correspondence to the structural characteristics and operational characteristics of the photodiode PD, the equivalent circuit of the sensor SN-1 may be different from the equivalent circuit of the sensor SN shown in FIG. 7.

Since there is no additional current amplification in the photodiode PD when light is applied thereto, its sensitivity to light may be less than phototransistors, but its reaction speed to the received light may be faster.

Figure 13:
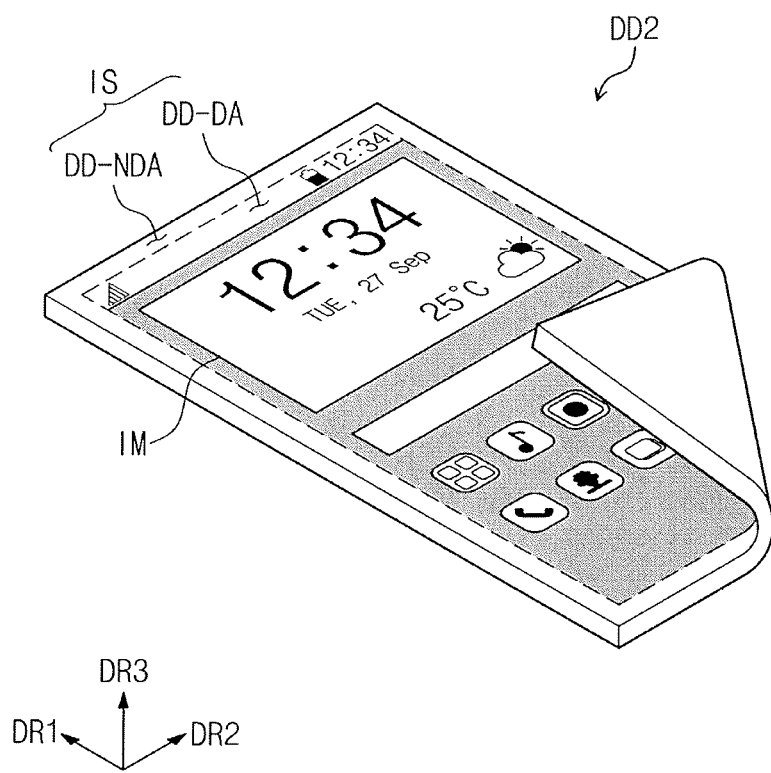
FIG. 13 is a perspective view of a display device according to an exemplary embodiment of the present inventive concept.
Figure 14:
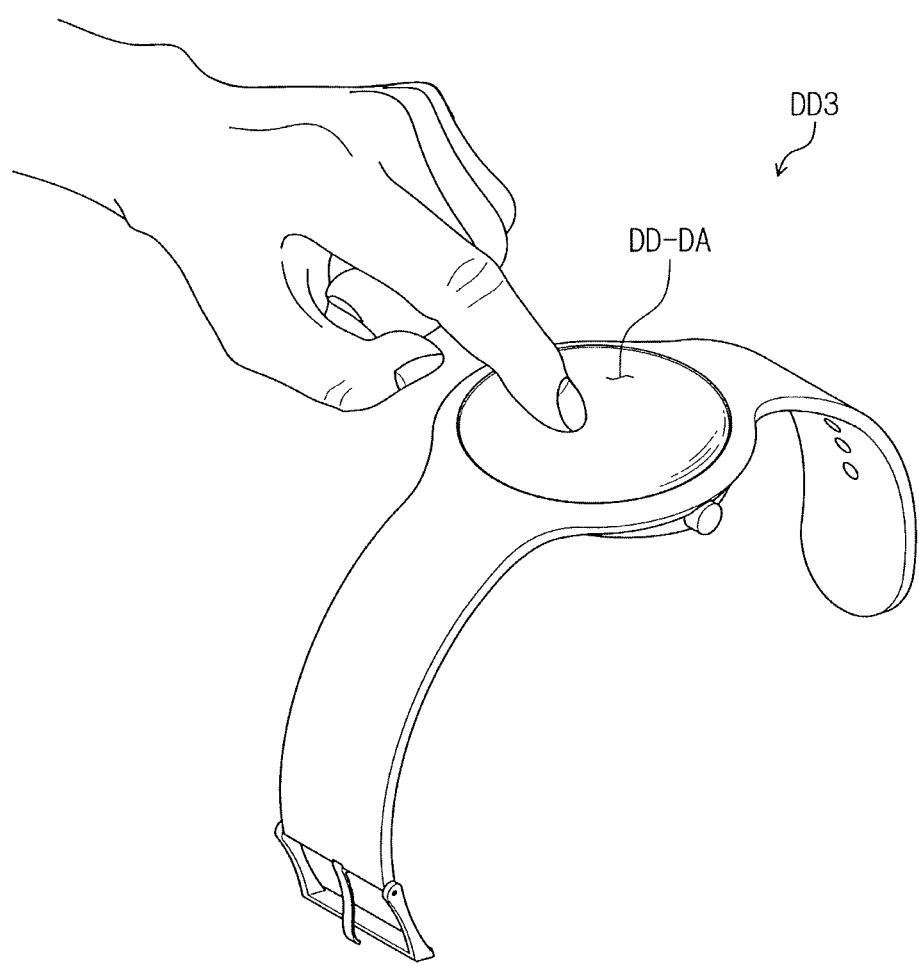
FIG. 14 is a perspective view of a display device according to an exemplary embodiment of the present inventive concept.

FIG. 13 is a perspective view of a display device DD2 according to an exemplary embodiment of the present inventive concept. FIG. 14 is a perspective view of a display device DD3 according to an exemplary embodiment of the present inventive concept.

Referring to FIG. 13, the display device DD2 may be partially or wholly bent, folded or rolled.

Referring to FIG. 14, the display device DD3 may be a wearable device worn on a part of a body. Although a watch-type device is shown in FIG. 14 as an example, the present inventive concept is not limited thereto and may have various forms to be worn on or connected to parts of the user's body.

According to an exemplary embodiment of the present inventive concept, a display device for scanning an image of a fingerprint with a high resolution may be provided.

According to an exemplary embodiment of the present inventive concept, a display device may be manufactured with simple manufacturing processes and a low cost.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. A display device comprising:
a display panel; and
a sensor layer disposed below the display panel and comprising a sensor, wherein, the display panel comprising:
a first base layer;
a circuit layer disposed on the first base layer and comprising a plurality of switching elements; and
a pixel layer disposed on the circuit layer and comprising a light emitting element, wherein the light emitting element is configured to receive a current from at least one of the plurality of switching elements to emit a first light,
wherein the sensor is configured to receive a second light generated when the first light is reflected by an external object, wherein the sensor layer is positioned below the light emitting element, wherein the sensor is positioned below the plurality of switching elements and does not overlap the at least one of the plurality of switching elements in a direction substantially perpendicular to an upper surface of the first base layer.

2. The display device of claim 1, wherein the second light passes through the first base layer.

3. The display device of claim 2, wherein the sensor layer further comprises a second base layer where the sensor is mounted.

4. The display device of claim 3, wherein the sensor comprises a photodiode.

5. The display device of claim 3, wherein the sensor comprises a phototransistor.

6. The display device of claim 3, wherein the sensor layer further comprises an optical lens overlapping the sensor.

7. The display device of claim 3, further comprising an adhesive layer disposed between the first base layer and the sensor layer, and having an opening corresponding to the sensor.

8. The display device of claim 3, further comprising a touch sensing circuit disposed on the pixel layer.

9. The display device of claim 1, wherein the external object is a fingerprint.

10. The display device of claim 9, further comprising a sensor control circuit configured to detect a change between the second light received by the sensor and the first light, wherein the detected change is used to recognize the fingerprint.

11. The display device of claim 1, wherein the light emitting element is an organic light emitting diode (OLED).

12. A display device comprising:
a display panel defined a display area where an image is displayed; and
a sensor layer disposed below the display panel and comprising a first sensor, wherein, the display panel comprising:
a base layer configured to transmit at least a part of incident light;
a circuit layer disposed on the base layer and comprising a plurality of switching elements; and
a pixel layer disposed on the circuit layer and comprising a plurality of light emitting elements disposed in the display area, wherein the plurality of light emitting elements is configured to receive a current from the plurality of switching elements to emit light,
wherein the first sensor is configured to receive a light emitted from at least one of the plurality of light emitting elements and reflected by an external object, wherein the pixel layer is disposed above an upper surface of the base layer, and the sensor layer is disposed on a lower surface, opposite the upper surface, of the base layer, wherein the first sensor is separated from a first switching element providing current to a first light emitting element by the base layer, wherein the first sensor and the first switching element are non-overlapping when viewed in a plane.

13. The display device of claim 12, wherein the external object is a fingerprint.

14. The display device of claim 13, further comprising a touch sensing circuit disposed on the pixel layer.

15. The display device of claim 14, further comprising a window member disposed on the touch sensing circuit.

16. The display device of claim 15, wherein the first sensor comprises a transistor having a bottom gate structure.

17. The display device of claim 16, wherein a fingerprint contact area corresponds to where the fingerprint contacts the window member, and when the fingerprint contacts the window member, a white light is generated by light emitting elements overlapping the fingerprint contact area.

18. The display device of claim 12, wherein the sensor layer further comprises a second sensor adjacent to the first sensor, wherein the first and second sensors are spaced apart from each other, and a spacing distance between the first sensor and the second sensor is between about 20 μm and about 100 μm.

19. The display device of claim 18, wherein the sensor layer further comprises a plurality of optical lenses correspondingly disposed on the first and second sensors, respectively.

20. The display device of claim 18, wherein the sensor layer further comprises an adhesive layer, wherein the adhesive layer includes a plurality of openings corresponding to the first and second sensors.

21. The display device of claim 1, further comprising a second base layer disposed below the first base layer, wherein the sensor layer is disposed between the first base layer and the second base layer, and the pixel layer is disposed above the upper surface of the first base layer.

* * * * *